United States Patent
Bures et al.

(10) Patent No.: US 8,869,080 B2
(45) Date of Patent: Oct. 21, 2014

(54) AUTOMATICALLY IDENTIFYING RESETTABLE FLOPS FOR DIGITAL DESIGNS

(71) Applicant: Apple Inc., Cupertino, CA (US)

(72) Inventors: Edmond R. Bures, Austin, TX (US); Fritz A. Boehm, Dripping Springs, TX (US)

(73) Assignee: Apple Inc., Cupertino, CA (US)

( * ) Notice: Subject to any disclaimer, the term of this patent is extended or adjusted under 35 U.S.C. 154(b) by 122 days.

(21) Appl. No.: 13/627,653

(22) Filed: Sep. 26, 2012

(65) Prior Publication Data

US 2014/0089873 A1    Mar. 27, 2014

(51) Int. Cl.
     *G06F 17/50*    (2006.01)

(52) U.S. Cl.
     USPC ......................................................... 716/102

(58) Field of Classification Search
     CPC .. G01R 31/041; G06F 17/5022; G06F 11/267
     See application file for complete search history.

(56) References Cited

U.S. PATENT DOCUMENTS

| | | | |
|---|---|---|---|
| 6,011,830 A | 1/2000 | Sasin et al. | |
| 6,301,687 B1 * | 10/2001 | Jain et al. | 716/107 |
| 7,478,028 B2 | 1/2009 | Ho et al. | |
| 7,729,891 B2 | 6/2010 | Fine et al. | |
| 8,615,692 B1 * | 12/2013 | Khurana et al. | 714/726 |
| 2003/0018932 A1 | 1/2003 | Blum et al. | |
| 2007/0010975 A1 * | 1/2007 | Fine et al. | 703/2 |
| 2007/0233762 A1 * | 10/2007 | Sudhakar | 708/250 |
| 2008/0141184 A1 * | 6/2008 | Dirks et al. | 716/2 |
| 2010/0017187 A1 * | 1/2010 | Hira et al. | 703/15 |

* cited by examiner

*Primary Examiner* — Vuthe Siek
*Assistant Examiner* — Aric Lin
(74) *Attorney, Agent, or Firm* — Lawrence J. Merkel; Meyertons, Hood, Kivlin, Kowert & Goetzel, P.C.

(57) ABSTRACT

An automated process identifies which components that retain their state need to be resettable in a design. The design is analyzed to identify components that retain their state and are non-resettable. A set of simulation tests is run on the design, where each test is known to pass when all components that retain their state are reset at reset. The tests are run with a respective logic value (1 or 0) randomly assigned to each non-resettable component at reset, until a test run fails. The failed test is rerun a specified number of times, each time with a different set of randomly assigned logic values provided to non-resettable components at reset. For each run, statistics are logged for each non-resettable component according to the test results and the logic value provided to the non-resettable component. The process determines which non-resettable components need to be resettable according to the statistics.

22 Claims, 4 Drawing Sheets

AUTOMATICALLY IDENTIFYING RESETTABLE FLOPS FOR DIGITAL DESIGNS

BACKGROUND

1. Technical Field

This disclosure relates to integrated circuit design, and more particularly to a method for manipulating and repartitioning a hierarchical design.

2. Description of the Related Art

Integrated circuit design flow is a complex process. Most often, a functional/behavioral description of the system/circuit is created with use of a register transfer language (RTL) or hardware description language (HDL) such as Verilog or VHDL (Very high speed integrated circuits Hardware Description Language). An important part of the design process is the creation of a logic implementation, and subsequently a transistor level implementation of these behavioral models. The creation of these implementations is oftentimes automated through the use of "synthesis" tools. Generally, a synthesis program is used to generate a netlist from the HDL models, making use of standard cell libraries containing a variety of circuit elements from which the integrated circuit may be constructed. Netlists usually include instances of the standard cells contained in the design, with the possible inclusion of custom blocks, and information descriptive of the connectivity between all the instances included in the integrated circuit. There are different types of netlists that can be used, including physical and logical netlists, instance-based and net-based netlists, and flat and hierarchical netlists. Typically, the final netlist generated by the synthesis tool is dependent on the constructs that appear in the HDL model. In other words, the style and syntax of various functional elements in the HDL oftentimes determines the type of elements and components that appear in the netlist generated by the synthesis tool.

In digital designs there is typically a primary input that will reset the design, placing the state of the machine in a suitable starting point for it to begin to operate. The basic component, or gate/element that is used to hold a particular state (i.e. either a high state—'1', or a low state—'0') is typically referred to as a flop (or flip-flop, oftentimes abbreviated as 'FF'), or more generally referred to as a latch. As mentioned above, most digital designs are typically coded in RTL to specify the design on a functional/logical level. In other words, RTL provides a high level, abstract, view of the design. As also mentioned above, the synthesis tool is used to convert the abstract RTL into a gate level netlist, leaving the design represented in constructs that directly map to constructs available in silicon. Because routing the reset signal—that is, the signal intended to reset the flops—around the design takes area, and because resettable-flops are typically larger than non-resettable-flops, most designs strive to include only the minimal number of resettable-flops. To put it another way, due to the size increase when a flop is made resettable, the goal in most designs is to minimize the number of flops that have to be resettable.

SUMMARY OF THE INVENTION

In one set of embodiments, a simulation methodology may be used to obtain information suggestive of which signals or buses of signals (or signal buses) in a circuit or system design need to be resettable. It should be noted here that in most cases the most accurate reset testing may be performed by running gate level simulations. While it is possible to code RTL such that Xs will not propagate, the behavior of the final circuit may be more accurately modeled in gate simulations. The information may be usable to minimize the number of resettable-flops to be included in the design, while also identifying those flops that need to be resettable. Simulation may be performed on the design, using 'X' to denote an uninitialized value (i.e., 'X' is denotes a value that has not been initialized). This helps in identifying instances where a flop/latch is uninitialized, that is, when it is non-resettable, since all non-resettable flops/latches will drive an X at reset. The logic simulators may propagate Xs when an X is input to a cell or equation. However, most simulators are not sophisticated enough to resolve what is known as X/Xbar issues (where Xbar is the logical complement value of X, e.g., if X=1, then Xbar=0, and vice-versa). X/Xbar is a term to denote situations where the output of the gate may be proven to have a defined value of 0 or 1, instead of X. An example of this would be performing a logical 'OR' on an X signal and the inverted value of that X signal, i.e. 'X OR Xbar'. The value of the output such an operation is expected to be 1 regardless of the logical value represented by X. To put it another way, the output of a logical 'OR' operation performed on a signal and its inverse will always be 1 regardless of whether the signal has a value of 1 or 0.

In order to work around the X/Xbar problem, the non-resettable-flops may have (random) values deposited at reset, which may prevent Xs from being propagated in the design. The set of signals that do not need to have random values applied may be left as X, and the set of signals that do need to have random values applied may be placed in a separate set. It is typical for gate level representations of designs to have their first simulations run with deposits of 0 to the set of flops that need to be initialized (i.e. values of 0 applied to the flops to reset the flops during simulation), but to more faithfully represent what might happen in actual silicon, the values are usually randomized to ensure that no particular value is required in the non-resettable-flops at reset. To put it another way, a first set of simulations may be run by resetting all the flops that need to be initialized for the simulation, whether the flops are resettable or not in hardware, to ascertain the validity/success of the simulations. However, once the simulations have successfully completed, additional simulations—for the same tests—may be run with randomized values for the flops.

In one set of embodiments, specific steps may be used to identify which gates (or flops) need to be resettable. While various steps of novel strategies for identifying resettable gates disclosed herein correspond to gate level simulations, the same strategies may be equally applied to any other level representation of the design (e.g. functional level, transistor level, etc.) According to one embodiment, the standard cells of a design may first be analyzed to identify which standard cells retain their state and are non-resettable. The standard cells represent the basic building blocks or primitives that the synthesis tool uses to generate a logical/circuit representation the design.

Next, a regression of tests/simulations may be run, where each test/simulation is known to pass when run at a higher-lever, e.g. RTL level. This facilitates avoiding errors and failures that are unrelated to gates/signals not having been reset at startup. For each test that passes higher-level simulation (or simulations not related to reset), random values may be assigned to each non-resettable instance (flop) whenever the reset signal in the design is asserted. That is, a determinate/definite value of '0' or '1' is randomly assigned to each non-resettable flop when the reset signal is asserted. This may be performed through a pseudo-random generator controlled by a seed, providing a degree of determinism to recreate the results of the test(s) as necessary. The tests may be run until a fail is logged by the regression system.

A run of P simulations may then be performed on the failing test. That is, for a particular test that fails when using random initial values for the flops, a specified number (P) of simulations may be performed for the particular test, each run using a different set of random values deposited in the flops/latches at reset. For each run of the test, the random values that were deposited into the non-resettable-flops may be logged. Certain statistics may also be logged for each signal once the simulations complete, taking into consideration only the failing simulation runs. Accordingly, for each signal, the following statistics may be logged:

If the test passes, and the value deposited into the flop at reset was '0', subtract 1 from a '0 tally' for that flop.
If the test passes, and the value deposited into the flop at reset was '1', subtract 1 from a '1 tally' for that flop.
If the test fails, the fail type may be noted.
For each fail type:
If the value deposited into the flop at reset was '0', add 1 to the '0 tally' for that flop.
If the value deposited into the flop at reset was '1', add 1 to the '1 tally' for that flop.

The tallied simulation results/statistics may be suggestive of which signal or bus of signals (flops) need to be reset. Signals that did not play a role in a failure may—on the average—have a tally of 0. Signals whose value affected the simulation may have nonzero tallies. For example, if the '1 tally' for a flop (signal) is a positive value after a specified number of simulations, the positive value may be indicative that the flop needs to be resettable. It should be noted that the specified number (of times that the test is run) may be selected to be sufficiently large to allow a pattern to emerge that would indicate whether the given flop/latch needs to be resettable. In many cases it might take a large number of iterations for a pattern to emerge, especially if the test either passes or fails for an extended number of runs.

Figure 1:
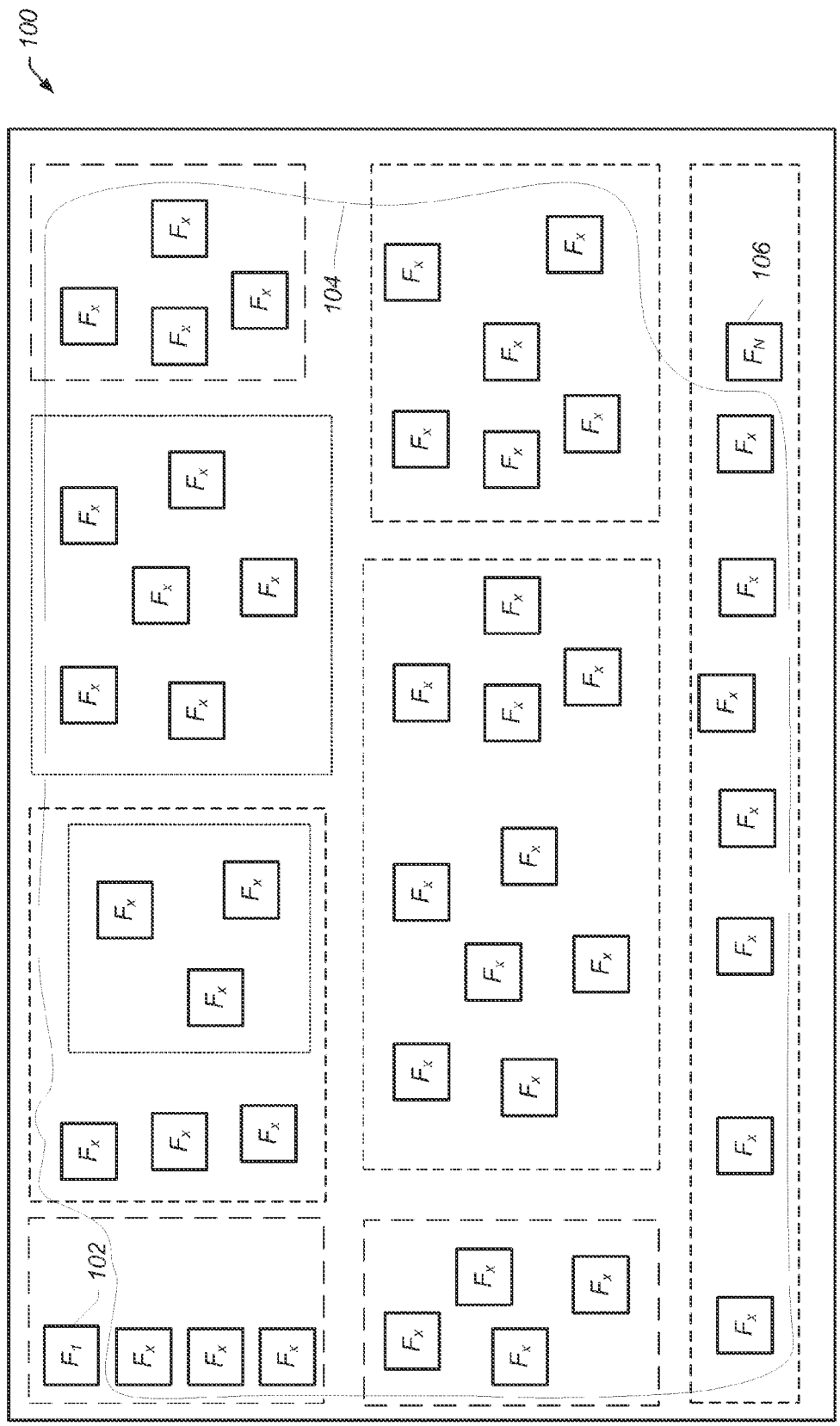
FIG. 1 is a simplified block diagram of one embodiment of a system with flops interspersed throughout.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

In one set of embodiments, a simulation methodology may be used to obtain information suggestive of which signals or buses of signals (or signal buses) in a circuit or system design need to be resettable. An automated test bench that includes a variety of tests may be implemented to identify resettable flops in a design. The information gathered and tallied based on the simulations performed by the automated test bench may be used to identify the minimum number of flops in the design that need to be resettable, including identifying which specific flops of all the flops in the design need to be resettable.

FIG. 1 is a simplified block diagram of a design 100, specifically showing flops interspersed in the design. Flops 102, 104, and 106 are shown for illustrative purposes to provide an overview of the possible distribution of flops in a design hierarchy. The various dashed rectangles represent different sub-circuits, macros, and/or hierarchical levels in the design, "flattened out" to provide a netlist-level overview of the design 100. Interconnectivity between flops 102, 104, and 106 and other components (not shown) of design 100 is implied, but omitted for the sake of simplicity. Each flop may provide an output signal based on an input signal, which may all be routed where required within design 100. The flops are grouped into a first flop 102, a last flop 106, and remaining flops 104 for organizational purposes as will be further explained below.

A design of a system or circuit or system-on-a-chip (SOC) or any other similar digital (or a portion of a mixed-signal analog/digital) system may be represented in RTL (Register Transfer Language) format (or other hardware description language format). The design may be a final design or it may be used as part of a larger circuit design. When a design is provided as a register transfer level (RTL) code base representing the integrated circuit (IC), the design may be synthesized to obtain a logic netlist and/or physical representation of the IC, which may then provide the basis for layout and fabrication. The RTL representation may be written in a hardware description language (HDL) such as Verilog or VHDL, for example. Once the design has been synthesized, or more generally once a gate-level representation or logic netlist of the design has been obtained, the standard cells—which the synthesis tool uses as the primary elements from which to assemble the design according to the RTL representation—may be analyzed to identify those individual standard cells in the entire design that retain their state (e.g. flops/latches) and are non-resettable. In one embodiment, this may specifically include identifying all individual instances of flops in the design that are currently non-resettable.

Figures 2, 3:
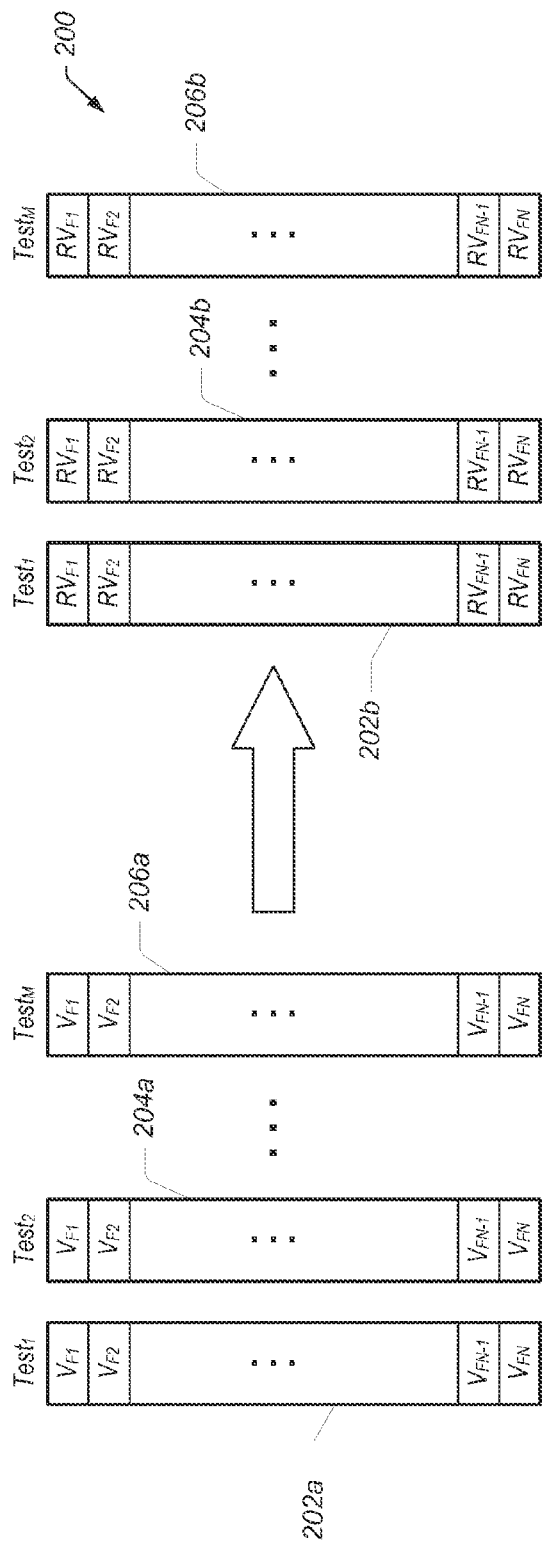
FIG. 2 is a diagram illustrating test vectors for simulating a design with deterministic and random initial values deposited into the flops, according to one embodiment.
FIG. 3 is a table organizing some of the statistics tallied during simulation performed according to the test vectors.

The flops that were identified (as described above) are illustrated in FIG. 1 as flops 102-106. It is again noted that design 100 is a greatly simplified representation of one embodiment of a possible design, shown for illustrative purposes to highlight the flops identified in the design as being non-resettable. A suite of tests including individual tests, such as regression tests, may be run to simulate/test design 100. The tests may feature a test vector representative of the values that are used to initialize the identified flops 102-106 (i.e. for flops $F_1$ through $F_N$). FIG. 2 shows a graphical representation of the test vectors, specifically illustrating (highlighting) the initial input values provided to flops $F_1$ through $F_N$, designated in FIG. 2 as values $V_{F1}$ through $V_{FN}$. There may be a total of M test vectors, shown for tests $Test_1$ (vector 202a), $Test_2$ (vector 204a), all the way through $Test_M$ (vector 206a). As shown in FIG. 2, values $V_{F1}$, $V_{F2}$, all the way through $V_{FN}$ represent reset values deposited into all the flops, as if all the flops were reset (though, as determined, the flops are actually non-resettable flops physically). However, it is possible to deposit these values into the flops in a simulation. Consequently, the design may be debugged or modified until all the selected tests pass, indicating that no functional and/or other failures occur when all the flops in the design are reset.

Once it has been ascertained that the test vectors 202a through 206a for tests $Test_s$ through $Test_M$ pass when all the flops are reset, each flop may have a randomly selected deterministic value of either '1' or '0' deposited at reset, preventing Xs from being propagated in the design. This provides a more faithful representation of what might happen in actual silicon. The values are randomized to ensure that no particular value would be required in a given non-resettable flop at reset, if in fact that flop remained non-resettable in silicon (i.e. in the actual physical implementation). FIG. 2 shows the new test vectors 202b, 204b, all the way through 206b corresponding to the same tests $Test_s$, $Test_2$, all the way through $Test_M$ as shown for test vectors 202a, 204a, all the way through 206a. The deterministic (i.e. having a value of '1' or '0') but randomly selected values deposited into each flop at reset for the given test are indicated by values $RV_H$, $RV_{F2}$, all the way through $RV_{FN}$. This way, a first set of simulations may be run by resetting all the flops that need to be initialized for the simulation (using test vectors 202a, 204a, all the way through 206a), whether the flops are resettable or not in hardware, to ascertain the validity/success of the simulations. Once the simulations have successfully completed, additional simulations—for the same tests $Test_1$, $Test_2$, all the way through $Test_M$—may be run with randomized values for the flops (using test vectors 202b, 204b, all the way through 206b), as illustrated in FIG. 2.

In one set of embodiments, specific steps may be used to identify which gates (or flops or signals output from the flops) need to be resettable. It should be noted again that while various steps of the strategies for identifying resettable gates disclosed herein correspond to gate level simulations, the same strategies may be equally applied to any other level representation of the design (e.g. functional level, transistor level, etc.), where the signals under investigation may be identified. In addition, the random values $RV_H$, $RV_{F2}$, all the way through $RV_{FN}$ for each test may be generated through a pseudo-random generator controlled by a seed, providing a degree of determinism that makes it possible to easily recreate the results of the test(s). The tests may be run until a fail is logged by the regression system.

Once a failing test has been logged, that is, one or more of tests $Test_1$, $Test_2$, through $Test_M$ fails, a specified number (P) of simulations may be run for the failing test. That is, for a particular test that fails when using random initial values for the flops, a specified number of simulations may be performed, each simulation with a different set of random values for the flops. For example, referring again to FIG. 2, $Test_1$ may be run using test vector 202b with a first set of randomly selected values ($RV_H$ through $RV_{FN}$), and logged as having failed for that set of values. $Test_1$ may then be run P times, each time with a different set of values $RV_H$ through $RV_{FN}$ in test vector 202b. For each run of the test, the random values that were deposited into the flops may be logged. That is, for each run of the test, the specific value $RV_F$ for each given flop, e.g. the value $RV_H$ for each run, the value $RV_{F2}$ for each run, through the value $RV_{FN}$ for each run, may be logged. Furthermore, a statistical tally may be kept and updated for each run of the test (of the specified number of P runs), to identify possible relationships between the test failure and the initial values $RV_F$ deposited into the flops. It should be noted here that the number of times the test is run may need to be specified to be sufficiently large in order for the statistical tally to provide a pattern indicative of which flops/latches need to be reset. Accordingly, for each signal/flop, the following statistics may be logged:

If the test passes, and the value deposited into the flop at reset was '0', subtract 1 from a '0 tally' for that flop.

If the test passes, and the value deposited into the flop at reset was '1', subtract 1 from a '1 tally' for that flop.

If the test fails, the fail type may be noted.

For each fail type:
If the value deposited into the flop at reset was '0', add 1 to the '0 tally' for that flop.
If the value deposited into the flop at reset was '1', add 1 to the '1 tally' for that flop.

Figure 4:
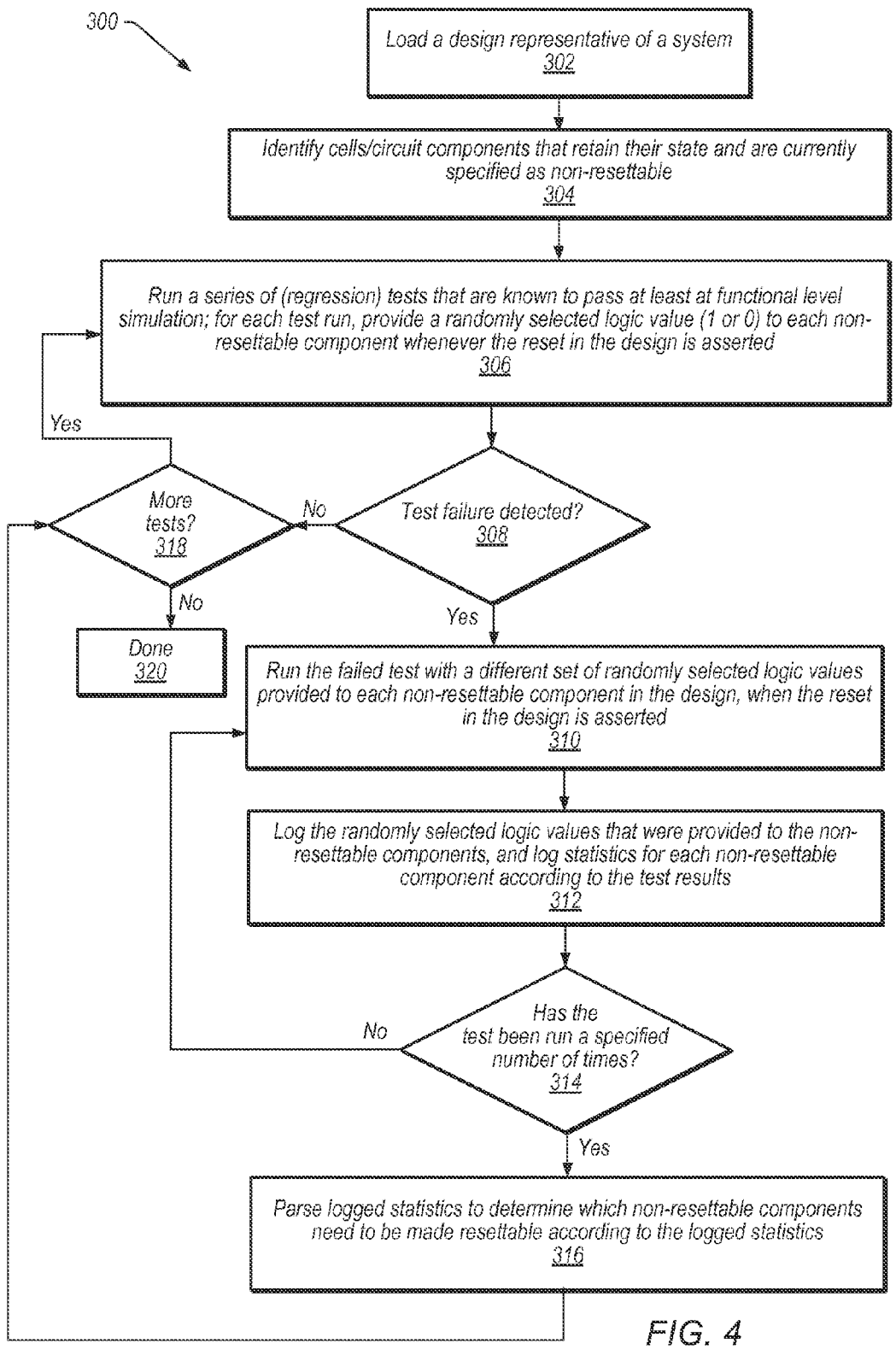
FIG. 4 is a flow diagram illustrating one embodiment of a method for automatically identifying resettable signals/flops in a design.

Table 400 in FIG. 4 provides an example of the statistical tally that may be kept for each flop. As shown in table 400, each flop $F_x$ ($F_1$, $F_2$, through $F_N$) may have a running count $T_{F(x)}$ representing the status of the flop with respect to failures for a given fail type. A respective '1' count and '0' count may be tracked for each flop. For each run of the test (as also described above), the count value may be adjusted based on the criteria enumerated above. For example, the count value $T_{F1(1)}$ may be increased by 1 each time the test fails and the value deposited into $F_1$ at the onset of the simulation was '1'. On the other hand, each time the test passes and the value deposited into $F_1$ at the onset of the simulation was '1', the count value $T_{F1(1)}$ may be decreased by 1. Similarly, the count value $T_{F1(0)}$ may be increased by 1 each time the test fails and the value deposited into $F_1$ at the onset of the simulation was '0', and each time the test passes and the value deposited into $F_1$ at the onset of the simulation was '0', the count value $T_{F1(0)}$ may be decreased by 1. The same tally may be kept for all the other flops represented in table 400. Therefore, by the end of the P runs performed for a given test, table 400 will hold count values for each value (1 and 0) for each flop.

The tallied simulation results/statistics in table 400 may be suggestive of which flop may need to be reset at the onset of the simulation (more specifically, whenever the reset signal is asserted in the design). Flops that did not play a role in a failure may—on the average—have a tally of zero (0), or tend to zero. For example, at the end of the P runs of the test, if flop $F_2$ did not play a role in the failures, $T_{F2(1)}$ will have a value of zero, or very close to zero (e.g. 1 or 2, etc.) For example, in one embodiment, a threshold value for the tally may be established, and if the tally is below the threshold value, then the corresponding flop/latch may be considered as one that did not play a role in the recorded failure(s). Flops that affected the simulation may have nonzero tallies, or may have a tally exceeding the specified threshold value. For example, if the '1 tally' for $F_1$ is a positive value (e.g. higher than a specified threshold value) after the specified number (P) of simulations, the positive value may be indicative that the flop/latch needs to be resettable.

FIG. 4 shows a flow diagram 300 illustrating one embodiment of a method to automatically identify resettable flops (i.e. flops that need to be resettable) in a design. In general, flow diagram 300 illustrates how to automatically identify signals or circuit components that retain their state (until at least a next clocking edge or gating signal may cause a change of state), and need to be resettable in the design. As indicated in 302, a design representative of a system (e.g. an integrated circuit, system-on-a-chip, and the like) may be loaded. In one embodiment, the design may have been initially represented in RTL on a functional level and may have been synthesized to obtain a netlist, while in other embodiments the design may have been obtained through some other, similar means. In any case, the design may include components—which may be standard cells in case of a synthesized design—that retain their state (e.g. flops, latches, or the like). As indicated in 304, those cells/circuit components in the design that retain their state and are currently specified as non-resettable may be identified.

Upon having identified the non-resettable components as described above, a series of (regression) tests that are known to pass at least functional level simulation may be run to simulate operation of the design (306). For each test run, a randomly selected logic value (1 or 0) is provided to each identified non-resettable component whenever the reset in the design is asserted (306). Upon detecting a test failure, that is, if at least one of the test runs results in a simulation failure, a new series of tests may be run (308, 'Yes' branch), as follows. The failed test (i.e. the test that failed with a set of randomly selected logic values provided to the non-resettable components at reset) is run with a different set of randomly selected logic values provided to each non-resettable component in the design when the reset in the design is asserted (310). The randomly selected logic values (provided to the non-resettable components at reset) are logged, and statistics are logged/recorded for each non-resettable component according to the test results (312).

The same test may be run a specified number of times, each time with a different set of randomly selected logic values provided to the non-resettable components at reset, and for each run the randomly selected logic values and statistics are logged (taking the 'No' branch at 314). Once the test has been run a specified number of times (taking the 'Yes' branch at 314), the logged statistics are parsed to determine which non-resettable components need to be made resettable according to the logged statistics (316). If more tests are to be run ('Yes' branch at 318), the process repeats starting at step 306. If all the desired test have been run ('No' branch at 318), the automated process of finding/identifying non-resettable components (flops) that need to be resettable is complete (320).

Figure 5:
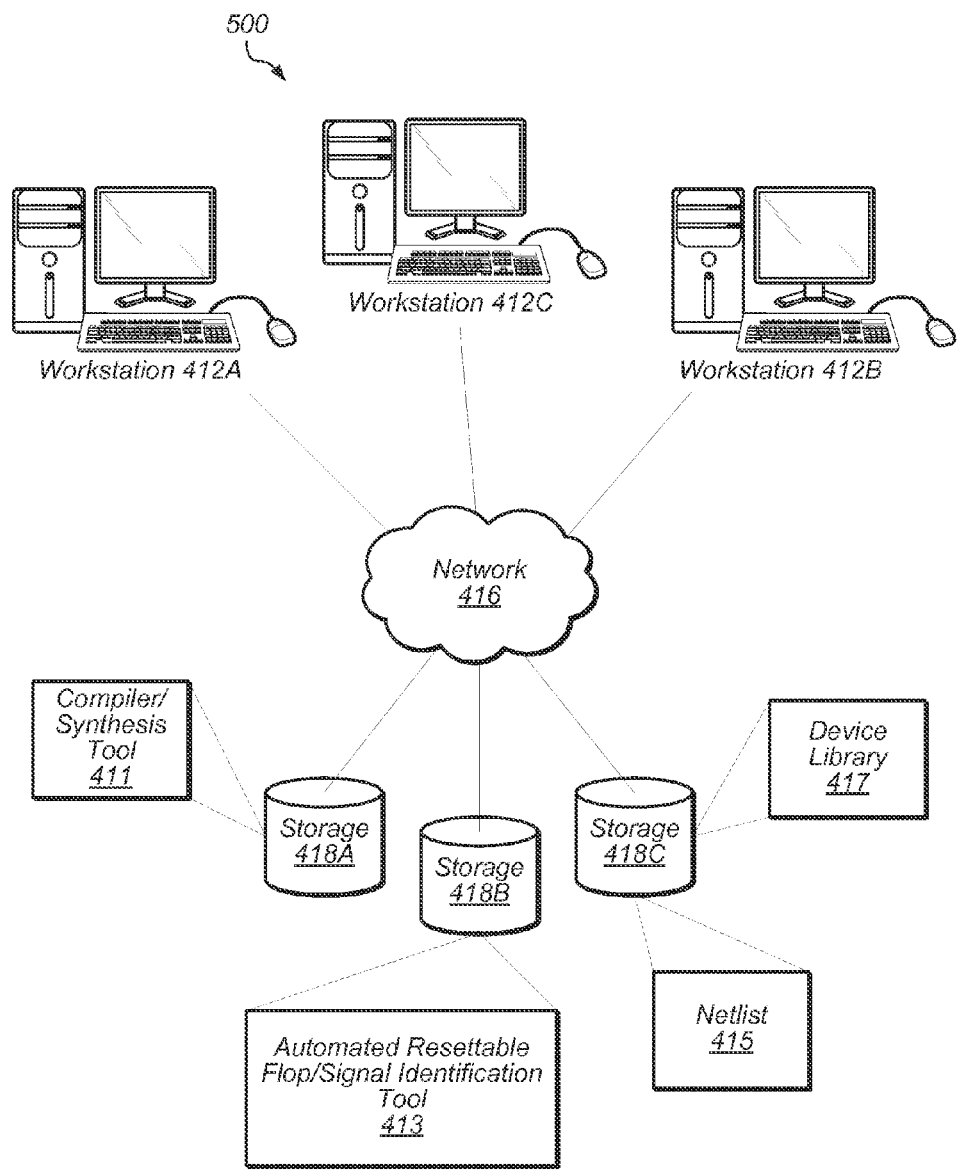
FIG. 5 is a block diagram of one embodiment of a computer system used to implement a design tool.

FIG. 5 shows a block diagram of one embodiment of a computer system used to implement a design tool for automatically detecting/identifying resettable-flops in a design that may be an integrated circuit design. The computer system 400 includes a number of workstations designated 412A through 412C. The workstations are coupled together through a network 416 and to a number of storage units designated 418A through 418C. In one embodiment, each of workstations 412A-412C may be representative of any standalone computing platform that may include, for example, one or more processors, local system memory including any type of random access memory (RAM) device, monitor, input output (I/O) means such as a network connection, mouse, keyboard, monitor, and the like (many of which are not shown for simplicity).

In one embodiment, storage units 418A-418C may be representative of any type of mass-storage device such as hard disk systems, optical media drives, tape drives, ram disk storage, and the like. As such, the program instructions that include the design tools, that is, program instructions representative of the design tools and executable to perform various design functions and design related operations, may be stored within any of storage units 418A-418C, and loaded into the local system memory of any of the workstations during execution. As an example, as shown in FIG. 5, the compiler/synthesis tool 411 is stored within storage 418A, while the resettable-flop identification tool (e.g. when the resettable-flop identification tool is a standalone script(s), and/or a program suite) 413 is shown stored within storage 418B, and the netlist 415 and the device library 417 are stored within storage 418C. Additionally, the program instructions may be stored on a portable/removable storage media. The program instructions may be executed directly from the removable media or transferred to the local system memory or mass-storage units 418 for subsequent execution. As such, the portable storage media, the local system memory, and the mass-storages may be referred to as non-transitory computer readable storage mediums. The program instructions may be executed by the one or more processors on a given workstation, or they may be executed in a distributed fashion among the workstations, as desired.

It is noted that although the computer system shown in FIG. 5 is a networked computer system, it is contemplated that in other embodiments, each workstation may also include local mass-storage. In such embodiments, the program instructions and the results of the design tools may be stored locally. Furthermore, it is contemplated that the program instructions may be executed on a standalone computer such as a personal computer that includes local mass-storage and a system memory. Generally, the program instructions may be executed on any platform and/or hardware configuration conducive to storing and manipulating data and programming instructions. In some embodiments, application specific hardware modules may also be designed if desired, to implement any or all of the elements of the processes described herein, for which such implementation is possible.

Various embodiments described above provide examples of a method for simulating a design, which may be a(n integrated) circuit design in such a manner as to identify which flops in the design need to be resettable. The method includes running a series of tests on the design, where each test is run multiple times (e.g. a specified number of times), each time with a different set of randomly assigned initial input values provided to selected flops in the design. For each test, statistics are logged for each flop according to the value deposited into the flop at the beginning of the simulation, and the outcome of the test (pass or fail). For each failing test, the failure type is noted, and the statistics for each flop are adjusted for the failing test and failure type.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for identifying components that need to be resettable, the method comprising:
    identifying, by a computing hardware device, in a design, components that retain their state and are non-resettable;
    running, by the computing hardware device, a series of tests on the design, wherein running the series of tests comprises providing, during each test of the series of tests, a randomly selected logic value to each non-resettable component upon reset;
    detecting, by the computing hardware device, that a first test of the series of tests fails;
    running, by the computing hardware device, the first test a specified number of times, each time with a different set of randomly selected logic values provided to the identified non-resettable components upon reset, wherein running the first test the specified number of times is responsive to detecting that the first test fails; and
    recording, by the computing hardware device, respective statistics corresponding to each respective identified non-resettable component upon completion of each respective run of the first test according to:
        a respective logic value of the randomly selected logic values provided to the respective identified non-resettable component upon reset; and
        a result of the respective run of the first test.

2. The method of claim 1, further comprising identifying which of the identified non-resettable components need to be resettable, based on the recorded respective statistics.

3. The method of claim 1, further comprising running the series of tests on a register transfer language (RTL) representation of the design prior to running the series of tests on the design.

4. The method of claim 3 further comprising adjusting the RTL representation of the design until the series of tests all pass upon running on the RTL representation of the design, prior to running the series of tests on the design.

5. The method of claim 1, further comprising generating the randomly selected logic values with a pseudo-random generator according to a seed value.

6. The method of claim 5, further comprising inputting a different respective seed value into the pseudo-random generator for each respective run of the first test.

7. The method of claim 1, wherein recording the respective statistics comprises:
    for each respective run of the first test, for each respective identified non-resettable component:
        adjusting, according to a result of the respective run of the first test, a first respective tally corresponding to the respective identified non-resettable component, if the respective logic value provided to the respective identified non-resettable component upon reset is '0'; and
        adjusting, according to the result of the respective run of the first test, a second respective tally corresponding to the respective identified non-resettable component, if the respective logic value provided to the respective identified non-resettable component upon reset is '1'.

8. A method comprising:
    running, by a computing hardware device, one or more tests on a netlist representation of a design, wherein the netlist comprises non-resettable standard cells that retain state, wherein the one or more tests are known to pass when run on a register transfer language (RTL) representation of the design, and wherein running the one or more tests comprises depositing randomly selected logic values into the non-resettable standard cells upon reset;
    detecting, by the computing hardware device, that a first test of the one or more tests fails;
    running, by the computing hardware device, the first test a specified number of times, comprising depositing a different set of randomly selected logic values into the non-resettable standard cells upon reset each time of the specified number of times that the first test is run, wherein running the first test the specified number of times is responsive to detecting that the first test fails; and
    recording, by the computing hardware device, respective statistics corresponding to each respective non-resettable standard cell upon completion of the first test each time of the specified number of times that the first test is run, wherein the respective statistic are recorded according to:
        a respective logic value of the randomly selected logic values deposited into the respective non-resettable standard cell upon reset; and
        a result of the first test.

9. The method of claim 8, further comprising identifying which of the non-resettable standard cells need to be resettable, based on the recorded respective statistics.

10. The method of claim 8, further comprising generating each different set of randomly selected logic values with a pseudo-random generator.

11. The method of claim 9, further comprising seeding the pseudo-random generator with a different respective seed for each different set of randomly selected values.

12. The method of claim 8, wherein the respective statistics comprise:
    a respective first count value for each respective non-resettable standard cell, wherein the first count value corresponds to a first logic value being deposited into the respective non-resettable standard cell upon reset; and
    a respective second count value for each respective non-resettable standard cell, wherein the second count value corresponds to a second logic value being deposited into the respective non-resettable standard cell upon reset.

13. The method of claim 12, further comprising:
    upon completion of the first test each time of the specified number of times that the first test is run:
        adjusting the first count value according to the result of the first test if the respective logic value deposited into the respective non-resettable standard cell upon reset is the first logic value; and
        adjusting the second count value according to the result of the first test if the respective logic value deposited into the respective non-resettable standard cell upon reset is the second logic value.

14. The method of claim 13;
    wherein adjusting the first count value comprises increasing the first count value when the first test fails, and decreasing the first count value when the first test passes; and wherein adjusting the second count value comprises increasing the second count value when the first test fails, and decreasing the second count value when the first test passes.

15. A system comprising:
one or more processing units configured to execute programming instructions; and
one or more memory elements configured to store programming instructions executable by the one or more processing units to:
 run a regression of tests on a design that comprises non-resettable components that retain their state;
 deposit randomly assigned logic values into the non-resettable components at reset when running the regression of tests;
 when a test of the regression of tests fails, run the test a specified number of times, responsive to detecting that the test fails;
 each time of the specified number of times the test is run:
  deposit a different set of randomly assigned logic values into the non-resettable components at reset;
  log statistics for each respective non-resettable component according to:
   results of the test; and
   a respective logic value of the randomly assigned logic values that was deposited into the respective non-resettable component; and
 determine based on the logged statistics which non-resettable components in the design need to be resettable.

16. The system of claim 15, wherein each test of the regression of tests is known to pass when all components that retain their state in the design are reset when a reset signal is asserted.

17. The system of claim 15, wherein the one or more memory elements are further configured to store programming instructions executable by the one or more processing units to:
 generate the randomly assigned logic values through a pseudo-random generator, according to a seed value.

18. The system of claim 17, wherein the one or more memory elements are further configured to store programming instructions executable by the one or more processing units to:
 provide a different seed value to the pseudo-random generator for each different set of randomly assigned logic values .

19. The system of claim 15, wherein the logged statistic comprise:
 a respective first count value for each respective non-resettable component, wherein the first count value corresponds to a logic value of '1' being deposited into the respective non-resettable component at reset; and
 a respective second count value for each respective non-resettable component, wherein the second count value corresponds to a logic value of '0' being deposited into the respective non-resettable component at reset;
 wherein the one or more memory elements are further configured to store programming instructions executable by the one or more processing units to:
  each time of the specified number of times that the test is run:

adjust the first count value according to the result of the test if the logic value of '1' is deposited into the respective non-resettable component at reset; and
  adjust the second count value according to the result of the test if the logic value of '0' is deposited into the respective non-resettable component at reset.

20. A computer readable non-transitory memory medium configured to store programming instructions executable to:
 identify components in a design that retain their state and are non-resettable;
 run a set of tests on the design to simulate operation of the design until a first test of the set of tests fails, wherein each test of the set of tests is known to pass when all components that retain their state in the design are reset at reset, and wherein each test of the set of tests is run with a respective logic value randomly assigned to each identified non-resettable component at reset;
 perform a specified number of runs of the first test, responsive to detecting that the first test fails, wherein each run of the specified number of runs is with a different set of randomly assigned logic values provided to the identified non-resettable components at reset;
 for each respective run of the specified number of runs, log statistics for each respective identified non-resettable component according to results of the respective run and a respective logic value of the randomly assigned logic values that was provided to the respective identified non-resettable component; and
 determine based on the statistics which identified non-resettable components in the design need to be resettable.

21. The computer readable memory medium of claim 20, wherein to log the statistics for each respective identified non-resettable component, the stored programming instructions are further executable to:
 if the respective run passes:
  if the respective logic value provided to the respective identified non-resettable component is 0, subtract 1 from a first tally corresponding to the respective identified non-resettable component;
  if the respective logic value provided to the respective identified non-resettable component is 1, subtract 1 from a second tally corresponding to the respective identified non-resettable component; and
 if the respective run fails:
  if the respective logic value provided to the respective identified non-resettable component is 0, add 1 to the first tally;
  if the respective logic value provided to the respective identified non-resettable component is 1, add 1 to the second tally.

22. The computer readable memory medium of claim 21, wherein to determine which identified non-resettable components in the design need to be resettable, the stored programming instructions are further executable to:
 parse the corresponding first tally and second tally for each identified non-resettable component, and whenever at least one of the first tally and the second tally corresponding to a respective identified non-resettable component is nonzero, mark that respective identified non-resettable component as needing to be resettable.

* * * * *